United States Patent
Yong et al.

(10) Patent No.: US 9,653,158 B2
(45) Date of Patent: May 16, 2017

(54) LIGHT INCIDENT ANGLE CONTROLLABLE ELECTRONIC DEVICE AND MANUFACTURING METHOD THEREOF

(71) Applicant: POSTECH ACADEMY-INDUSTRY FOUNDATION, Pohang-si (KR)

(72) Inventors: Kijung Yong, Pohang-si (KR); Jinjoo Park, Seoul (KR)

(73) Assignee: POSTECH ACADEMY-INDUSTRY FOUNDATION, Gyungbuk (KR)

(*) Notice: Subject to any disclaimer, the term of this patent is extended or adjusted under 35 U.S.C. 154(b) by 56 days.

(21) Appl. No.: 14/465,378

(22) Filed: Aug. 21, 2014

(65) Prior Publication Data

US 2015/0124513 A1   May 7, 2015

(30) Foreign Application Priority Data

Nov. 5, 2013  (KR) .................... 10-2013-0133400

(51) Int. Cl.
*H01L 31/0352* (2006.01)
*G11C 13/00* (2006.01)
*G11C 13/04* (2006.01)

(52) U.S. Cl.
CPC ........ *G11C 13/0002* (2013.01); *G11C 13/047* (2013.01)

(58) Field of Classification Search
CPC ................................................. H01L 31/0352
(Continued)

(56) References Cited

U.S. PATENT DOCUMENTS 6,277,330 B1 *  8/2001  Liu ................... G01N 21/552
                                        422/82.05
7,948,096 B2 *  5/2011  Ho .................... G03F 7/70341
                                        257/798
(Continued)

OTHER PUBLICATIONS

Jinjoo Park et al, "A Light Incident Angle Switchable ZnO Nanorod Memristor: Reversible Switching Behavior Between Two Non-Volatile Memory Devices", Adv. Mater. 2013, Wiley-VCH Verlag GmbH & Co. KGaA, Article first published online: Sep. 1, 2013, DOI: 10.1002/adma.201303017.

*Primary Examiner* — Min Huang
(74) *Attorney, Agent, or Firm* — Steptoe & Johnson LLP

(57) ABSTRACT

Disclosed herein is a method of changing characteristics of an electronic device, including the steps of: applying light to an electronic device through a plurality of media having different refractive indexes from each other, the electrical characteristics of the electronic device being changed depending on the amount of incident light; and changing an incident angle of light applied the electronic device to adjust the amount of incident light. There is provided a method of providing light incident angle dependency by a simple procedure of accumulating additional media in various electronic devices. In the method, the light incident angle selectivity of the electronic device can be maintained even when the inclination angle of the device is changed depending on the axis parallel to the incident direction of light even though the incident direction thereof is fixed. This means that the performance of the device can be controlled only by changing the inclination angle of the device without greatly changing the dynamic state of the device. Further, since the movement speed of photons is higher than that of electrons and the signal interference of photons is lower than that of electrons, an additional effect of increasing the operating (Continued)

speed of the device or decreasing the size of the device can be expected.

3 Claims, 4 Drawing Sheets

(58) Field of Classification Search
USPC .......................................................... 977/700
See application file for complete search history.

(56) References Cited

U.S. PATENT DOCUMENTS

| | | | | |
|---|---|---|---|---|
| 8,969,986 | B1* | 3/2015 | Yap | H01L 31/0236 257/432 |
| 2008/0122804 | A1* | 5/2008 | Kinoshita | G06F 1/3203 345/175 |
| 2008/0216895 | A1* | 9/2008 | Aoki | H01L 31/0322 136/265 |
| 2009/0237977 | A1* | 9/2009 | Ramani | G11C 11/5678 365/148 |
| 2009/0268176 | A1* | 10/2009 | Kawashima | G03F 7/70341 355/30 |
| 2010/0195873 | A1* | 8/2010 | Cui | G01B 11/2441 382/106 |
| 2011/0136288 | A1* | 6/2011 | Duane | H01L 21/02381 438/59 |
| 2011/0309265 | A1* | 12/2011 | Babinec | G01N 21/64 250/459.1 |
| 2012/0129269 | A1* | 5/2012 | Choi | A61B 5/0075 436/164 |
| 2012/0322164 | A1* | 12/2012 | Lal | B82Y 10/00 436/501 |
| 2013/0171738 | A1* | 7/2013 | Choi | G01N 27/06 436/150 |
| 2014/0128972 | A1* | 5/2014 | Khraiche | A61L 27/18 623/6.63 |
| 2014/0202530 | A1* | 7/2014 | Vasylyev | G01J 1/0407 136/256 |
| 2015/0209586 | A1* | 7/2015 | Silva | A61L 27/18 607/54 |
| 2015/0214261 | A1* | 7/2015 | Park | G02B 5/287 257/432 |

* cited by examiner

LIGHT INCIDENT ANGLE CONTROLLABLE ELECTRONIC DEVICE AND MANUFACTURING METHOD THEREOF

BACKGROUND OF THE INVENTION

1. Technical Field

The present invention relates to a light incident angle controllable electronic device and a manufacturing method thereof. More particularly, the present invention relates to an electronic device, the electrical characteristics of which are changed depending on the incident angle of incoming light, and to a manufacturing method thereof.

2. Description of the Related Art

The common problem with various electronic products as necessities of modern society is that information transmission is basically induced by electrical stimulation, that is, electron migration. However, with a decrease in the size of an electronic device, the physical position between two transmission lines becomes closer, whereas signals are damaged or distorted by strong interaction between electrons, thus causing an electrical signal interference problem and lowering system efficiency. In order to solve this problem, when light, which is superior in terms of high movement speed, noninterference characteristics, parallel movement characteristics, high integration easiness and the like, is used, it is expected to offer a novel information processing method using photoelectric signals. Here, particularly, when a semiconductor circuit recognizing the irradiation direction of photoelectric signals and exhibiting two different electrical characteristics according the direction thereof is realized, it will become a motive power for opening a motion-controllable high-technology age. In order to recognize data and process information using light, it is required to develop a method of converting light into optical information and transmitting the optical information as well as a method of freely controlling the flow of light. However, it takes a lot of time to develop such technology or equipment. Therefore, a method of making up for the weak points in an electronic information transmission system without changing the structure of an electronic device is required.

SUMMARY OF THE INVENTION

Accordingly, the present invention has been devised to solve the above-mentioned problems, and an object of the present invention is to provide a method of allowing an electronic device to have light incident angle selectivity.

Another object of the present invention is to provide a novel electronic device having light incident angle selectivity.

In order to accomplish the above object, an aspect of the present invention provides a method of changing characteristics of an electronic device, including the steps of: applying light to an electronic device through a plurality of media having different refractive indexes from each other, the electrical characteristics of the electronic device being changed depending on the amount of incident light; and changing an incident angle of light applied to the electronic device to adjust the amount of incident light.

In the present invention, a first medium having a first refractive index is disposed on the surface of the electronic device, and the light penetrates a second medium having a second refractive index larger than that of the first refractive index and then penetrates the first medium disposed on the surface of the electronic device to allow the light to be applied to the electronic device, whereby the amount of the light is changed depending on the change in the incident angle of the light. Preferably, the refractive index of the first medium disposed on the surface of the electronic device may be lower than that of the second medium.

In an embodiment of the present invention, in order to allow the electronic device to exhibit total reflection as an extreme refraction characteristic, it is preferred that a first medium having low optical density be disposed on the electronic device and a second medium having high optical density be disposed on the first medium. The light applied from a light source to the second medium is refracted or totally-reflected at the interface between the two media, thus controlling the amount of light reaching the electronic device. The light source may be disposed in the air over the second medium, but, preferably, may be disposed in the second medium in consideration of attenuation and absorption characteristics of light.

In the present invention, with the intention of total reflection as an extreme refraction characteristic, the structure of a medium may be limited depending on optical density, but is not limited thereto. Further, the arrangement of the first and second media may be relatively different. The two media may be solid media, but liquid or gas media may be arranged on the electronic device in order to reversibly change an arrangement structure. When the two media are not solid media, it is difficult for a medium having high optical density to be naturally disposed on a medium having low optical density because optical density is generally in proportion to mass density. In order to solve this problem, it is preferred to form the two fluidic media into stable boundary and structure using a superhydrophobic surface treatment. A superhydrophobic surface, on which water does not adhere or weakly adheres, may be configured in the following order on an electronic device: air (first medium) and water (second medium) from the bottom, because it tends to possess an air layer between the surface and a water layer when it is immersed into water. Here, this air layer provides an environment for protecting the electronic device and connector not being sealed with an insulator and the electrode wiring connecting devices from water to stably operate the electronic device.

In the present invention, the first medium may include gas, preferably oxygen that can control the oxidation state of the electronic device, and more preferably air that can be used at low cost.

In the present invention, preferably, the first medium may be a transparent superhydrophobic layer including gas having a low refractive index. A superhydrophobic surface can be generally obtained by the combination of high surface roughness and chemical coating for offering water repellency. Nanofibers have structural characteristics of increasing optical reactivity and physical characteristics of providing a superhydrophobic surface. The transparent superhydrophobic layer may be formed by accumulating air between nanostructures treated with fatty acid, an SAM material or a compound having low surface energy such as a fluorine compound.

In an embodiment of the present invention, the fluorine resin, which is a material for superhydrophobic surface treatment, is advantageous in that it has low surface energy, does not exert an influence on the electrical characteristics of the electronic device, does not deteriorate transparency, and is not damaged by optical stimulation. The fluorine resin may be poly[4,5-difluoro-2,2-bis(trifluoromethyl)-1,3-dioxole-co-tetrafluoroethylene]. The chemical coating of the material for superhydrophobic surface treatment may be easily performed by applying the fluorine resin onto the nanostructured device using spin coating.

In the present invention, the nanostructure is a nanowire, nanotube or nanorod disposed on the surface of the electronic device. Preferably, the nanostructure may be a nanowire vertically grown on the surface of the electronic device. The nanostructure may be made of various kinds of oxides. Examples of the oxides may include $Al_2O_3$, $SiO_2$, $TiO_2$, VO, $VO_2$, $V_2O_3$, $V_2O_5$, MnO, $MnO_2$, FeO, $Fe_2O_3$, $Fe_3O_4$, CoO, $Co_2O_3$, $Co_3O_4$, NiO, CuO, $Cu_2O$, $Y_2O_3$, $ZrO_2$, NbO, $NbO_2$, $Nb_2O_5$, $MoO_2$, $MoO_3$, $RuO_2$, PdO, AgO, CdO, $In_2O_3$, SnO, $SnO_2$, $Sb_2O_3$, $Sb_2O_5$, $HfO_2$, $Ta_2O_5$, $WO_3$, $IrO_2$, NiO, NO, $N_2O$ and MgO.

In the present invention, more preferably, the nanostructure may be made of zinc oxide. Zinc oxide can be easily synthesized into large-area nanostructures at low temperature. Further, this zinc oxide nanostructure exhibits resistance variation characteristics in terms of information processing and stability because the digital states "0" and "1" can be maintained for a long time when it is applied to a memory device.

In the present invention, the nanostructure, preferably a zinc oxide nanofiber, and more preferably, a zinc oxide nanowire, can be directly grown using each part of the electronic device as a seed layer. For the purpose of vertically-aligned growth of the nanostructure, a seed layer having a nanometer scale thickness may be formed on the surface of the electronic device before the formation of the nanostructure. The seed layer may be formed on a buffer layer by chemical deposition, sputtering, evaporation or a sol-gel process. Here, the material constituting the buffer layer may be selected from among Zn, Au, Ag, ZnO, GaN, SiC and TiN, but is not limited thereto. Preferably, the seed layer may be a zinc oxide thin film or an aluminum-doped zinc oxide thin film.

When a nanofiber is formed on the electronic device, the electronic device can obtain light incident angle selectivity. However, preferably, when the electronic device is configured in the form of a nanofiber, there are advantages in that the integration degree thereof can be improved, and simultaneously the optical reactivity thereof can be maximized because of its large specific surface area.

In the present invention, the second medium may have lower optical density than that of the first medium, and may have a higher refractive index than that of the first medium. As the second medium, a liquid may be used. Preferably, as the second medium, a polar liquid, preferably water, may be used such that water repellency can be realized by a compound having low surface energy.

In the present invention, the light source may be selected from the group consisting of an incandescent lamp, a halogen lamp, a discharge lamp and an LED lamp, but is not limited thereto.

In the present invention, the electronic device can exhibit electrical characteristics different from each other when light is totally-reflected from the electronic device while changing its incident angle and when light is incident upon the electronic device while changing its incident angle. The amount of light reaching the electronic device is changed drastically based on the critical angle at which total reflection occurs. Since the first medium located at the lower layer of the electronic device is directly brought into contact with zinc oxide, it can directly influence the electrical characteristics of zinc oxide. Particularly, oxygen existing in the air layer is easily adsorbed on the surface of the zinc oxide nanowires constituting the electronic device to attract electrons, and exert an influence on the entire surface level.

When zinc oxide receives light to cause photo-excitation, oxygen adsorbed on the surface thereof is detached therefrom, and thus the electrical characteristics of zinc oxide are changed again by the surface state thereof. Owing to a series of such processes, when light is applied at an incident angle larger than the critical angle, general resistor characteristics are exhibited, but, when light is applied at an incident angle smaller than the critical angle, memristor characteristics are exhibited.

In the present invention, the incident angle can be changed depending on the change in location of a light source or the change in gradient of the electronic device.

In an embodiment of the present invention, the electronic device, which is provided on the surface thereof with a transparent hydrophobic layer including nanostructures and gas, and the electrical characteristics of which are changed by the amount of incident light, is irradiated with light, and simultaneously the incident angle of light is changed to totally-reflect or apply the light, thereby realizing the characteristics of a resistor and the characteristics of a memristor, respectively. The transparent hydrophobic layer includes: zinc oxide nanowires vertically grown on a zinc oxide thin film to a length of 600 nm or less and treated with a fluorine compound; and air collected in layers between the zinc oxide nanowires. The electronic device is configured such that voltage is applied to upper and lower surfaces of a laminate including a transparent indium-doped tin oxide electrode layer, a glass substrate layer and a zinc oxide layer.

Another aspect of the present invention provides an electronic device having light incident angle selectivity, including: a glass substrate coated with a transparent indium-doped tin oxide electrode; a zinc oxide layer disposed on the glass substrate; a gold electrode patterned on the zinc oxide layer; a hydrophobic electronic device comprising a transparent hydrophobic layer including zinc oxide nanowires grown on the zinc oxide layer patterned with the gold electrode and surface-treated with a fluorine compound and air collected in layers between the zinc oxide nanowires; a water layer existing on the surface of the hydrophobic electronic device; and a light source applying light to the electronic device, wherein the light applied to the electronic device is totally-reflected or applied at a predetermined angle to allow the electronic device to have light incident angle selectivity.

BRIEF DESCRIPTION OF THE DRAWINGS

FIGS. 2b and 2c show memristor characteristics and resistor characteristics, respectively, which can be reversibly obtained depending on the change of incident angle.

FIG. 4 presents graphs showing the results of evaluating the electrical characteristics of the electronic device, which are repeatedly and stably exhibited in water, wherein

DESCRIPTION OF THE PREFERRED EMBODIMENTS

The objects, features and advantages of the present invention will be more clearly understood from the following detailed description of the preferred embodiments taken in conjunction with the accompanying drawings.

Hereinafter, preferred embodiments of the present invention will be described in detail with reference to the attached drawings.

Embodiment 1

Combination of Electric Device Structure and Light Angle Control Technology A device having a simple metal-insulator-metal (MIM) structure was superhydrophobically surface-treated to realize a structure in which air layers are accumulated in water, thus obtaining device characteristics changed depending on the incident angle of a light source. For this purpose, a zinc oxide thin film, used as a semiconductor layer having a MIM structure, was grown to a thickness of 30 to 40 nm on a glass substrate (surface resistance: 60 $\Omega/cm^2$, manufactured by Aldrich Corporation) coated with a transparent indium-doped tin oxide electrode for 5 min using RF sputtering under the conditions of a power of 50 W, a pressure of 8 mtorr and room temperature. An ITO electrode was used as a lower electrode having a MIM structure, and a gold electrode was used as an upper electrode. The ITO electrode and the gold electrode were patterned using a shadow mask through thermal evaporation.

The glass substrate provided with a MIM structure was immersed into a mixed solution of an aqueous 10 Mm $Zn(NO_3)_2.6H_2O$ (purity: 98%) solution and 1 Ml of an aqueous ammonia solution (percent concentration: 28%) for 2 hours at 95° C. After zinc oxide nanowires were grown, the glass substrate was washed with deionized water and then dried by blowing nitrogen ($N_2$).

In order to coat the surface of the zinc oxide nanowires with fluorine resin, a solution containing poly[4,5-difluoro-2,2-bis(trifluoromethyl)-1,3-dioxole-co-tetrafluoroethylene] was applied onto the surface thereof for 30 seconds at a spinning rate of 500 rpm and for 30 seconds at a spinning rate of 2000 rpm by spin coating, and was then dried on a hot plate for 10 min at 50° C. This procedure was repeatedly carried out five times. When the zinc oxide nanowires are coated with the fluorine compound, the tips of a fluorine resin material are exposed to the surface of the zinc oxide nanowires. Therefore, water droplets are likely to stand at the tips of the nanowires, and the surface of the nanowires becomes a superhydrophobic surface.

Figure 1A:
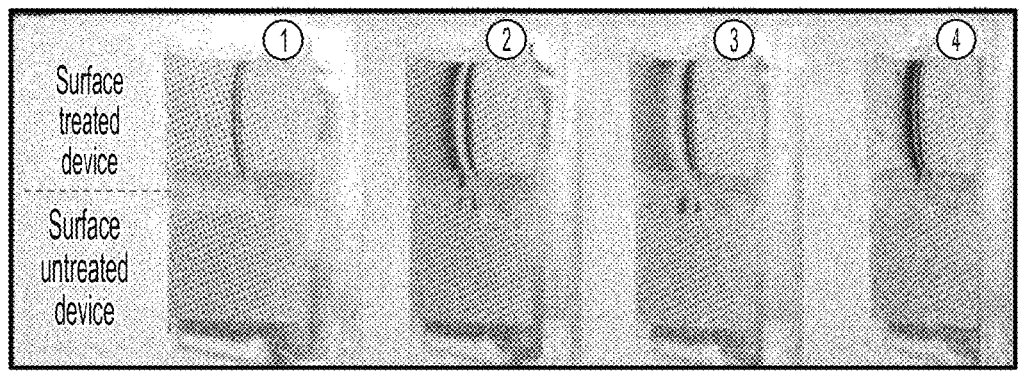
FIG. 1a presents photographs showing the difference in wettability between a surface-treated device and a non-surface-treated device when their gradients are changed, and presents photographs showing the mirror image characteristics thereof (③, ④) attributable to an air layer when the gradient of the surface-treated device is higher than a critical angle.
Figure 1B:
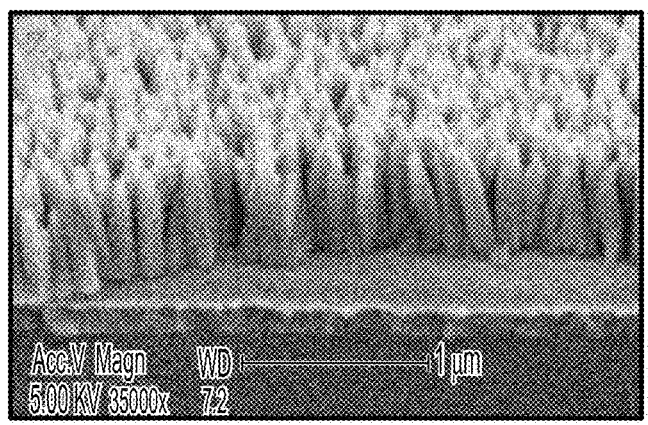
FIG. 1b shows the lateral scanning electron microscope (SEM) images of nonowires existing on the surface of the device.
Figure 1C:
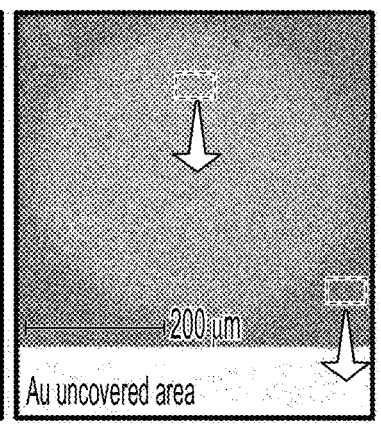
FIG. 1c shows the planar scanning electron microscope (SEM) images of nonowires existing on the surface of the device.

FIG. 1a presents photographs showing the difference in wettability between a surface-treated device and a non-surface-treated device, FIG. 1b shows the lateral scanning electron microscope (SEM) images of nonowires existing on the surface of the device, and FIG. 1c shows the planar scanning electron microscope (SEM) images of nonowires existing on the surface of the device. As shown in FIG. 1, zinc oxide nanowires were formed on two ITO glass substrates in the same manner to prepare two electronic devices, and one electronic device (upper portion of FIG. 1a) was superhydrophobically surface-treated and the other electronic device (lower portion of FIG. 1a) was not superhydrophobically surface-treated. Comparing the two devices, they were disposed at the same angle and partially immersed into water, and then their gradients were gradually changed. Here, the non-surface-treated device was wet because a boundary did not exist on the interface making contact with water, whereas the surface-treated device is configured such that nanowires are provided on the surface thereof with an air layer due to superhydrophobicity when this device was immersed in water. In the surface-treated device, owing to the difference in refractive index between the air layer and water, the appearance of the transmitted device is seen at a view angle below critical angle, whereas a mirror image is seen at a view angle above critical angle through a total reflection phenomenon (refer to ③, ④). The surface structure of the fluorine resin-coated zinc oxide nanowire substrate was observed by a field emission scanning electron microscope (FESEM: JEOL, Model JSM 330F). As shown in FIG. 1b, a nanowire had a length of about 600 nm and a diameter of about nm. When the length of a nanowire increases, superhydrophobiity is improved, but transparency is deteriorated because light is scattered by nanowires. Therefore, for the purpose of improving transparency, nanowires having an optimum length of about 600 nm were synthesized.

Embodiment 2

Realization of Memory Device Using Light Angle Control Technology

A light angle control technology was applied to a resistive switching memory device. FIG. 2 shows the refraction angle and direction of a light source and the characteristics of a resistive switching memory device when a superhydrophobically surface-treated electronic device is immersed in water.

Figure 2A:
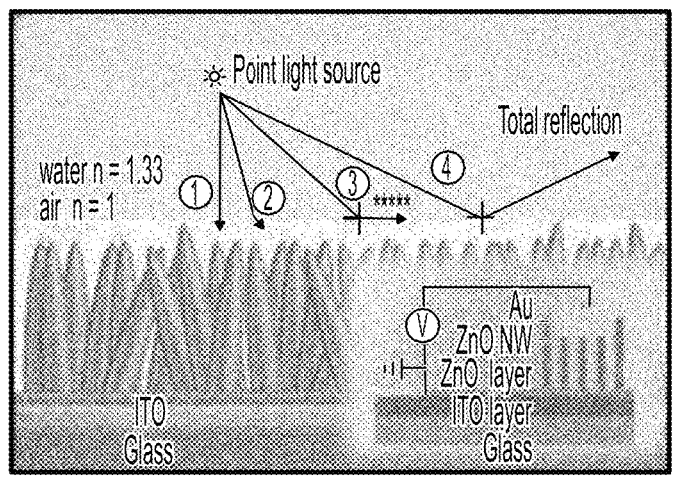
FIG. 2a is a schematic view showing the refraction angle and direction of a light source when a superhydrophobically surface-treated electronic device is immersed in water.

As shown in FIG. 2a, the characteristics of the resistive switching memory device are evaluated by connecting the lower electrode (ITO) and upper electrode (Au) of the resistive switching memory device with a platinum probe connected to a probe station (E5270A, Agilent Inc.) to apply a voltage. In order to evaluate the reaction characteristics of the resistive switching memory to a light incident angle, the total process was performed in water, and simultaneously, the change in electrical performance of the resistive switching memory was observed by adjusting the angle of a light source.

Figure 2B:
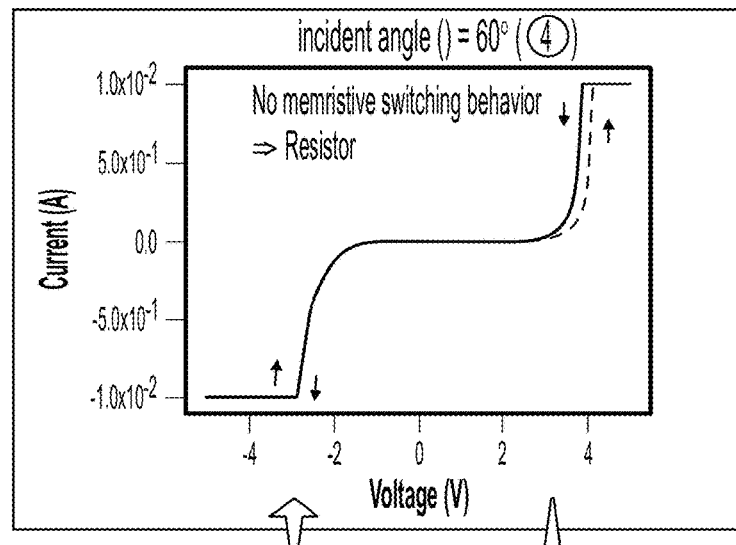
FIG. 2b is a graph showing the results of evaluating voltage-current characteristics with respect to light incident angle higher than critical angle.
Figure 2C:
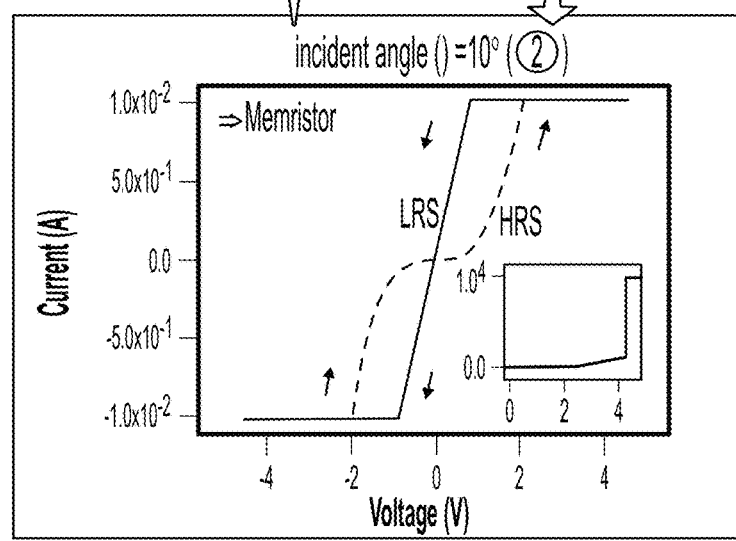
FIG. 2c is a graph showing the results of evaluating voltage-current characteristics with respect to light incident angle lower than critical angle.

FIGS. 2b and 2c show voltage-current characteristics. FIG. 2b shows the voltage-current characteristics occurring when light is applied at an incident angle of 60° higher than the critical angle. From FIG. 2b, it can be ascertained that the green graph occurring when voltage was continuously changed from −5V to +5V (when forward bias was applied) is nearly identical to the orange-colored graph occurring when reverse bias was applied from +5V to −5V. This means that the applied voltage acted as a general resistor without exerting an influence on the position of an energy band or the movement of an internal carrier. Meanwhile, FIG. 2c is a graph showing the voltage-current characteristics occurring when light is applied at an incident angle of 10° lower than the critical angle, and shows the characteristics of a resistive switching memory device (memristor). As shown in FIG. 2c, it is observed that the flow rate of current rapidly increases when a voltage of 4V or more is applied to the device in the early stage. This first procedure is defined as "forming". Through this first procedure, the state of the device is converted into a low resistance state (hereinafter, referred to as "LRS") having a low resistance value. It is observed (blue line) that the flow rate of current decreases at a voltage of about −2V when negative voltage is further applied to the LRS device. This procedure is defined as "reset". Through this procedure, the state of the device is converted into a high resistance state (hereinafter, referred to as "HRS") having a high resistance value. When positive voltage is further applied to the HRS device, the flow rate of current increases again at a voltage of about 2V, which is still lower than the initial forming voltage. This procedure is defined as "set". From the second circulation procedure, voltage is applied through the set and reset procedures, and thus the resistance of a predetermined resistive switching material is reversibly changed from LRS to HRS. This characteristic is generally called "resistive switching characteristic".

Figure 3:
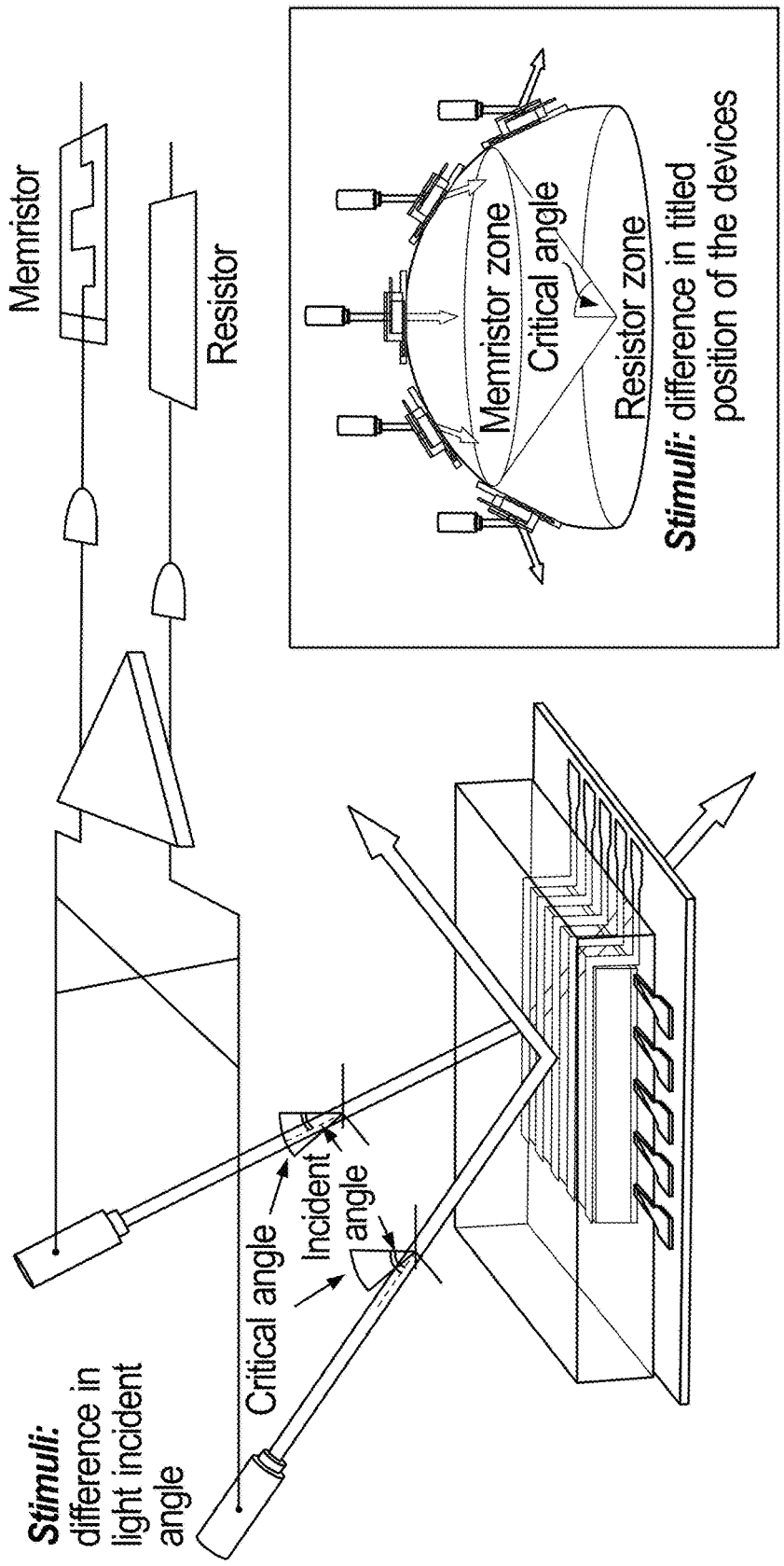
FIG. 3 is a digital circuit diagram showing that the route of light is changed depending on the incident angle thereof, and thus two characteristics, that is, memristor characteristics and resistor characteristics are reversibly represented in the same electronic device, and includes schematic views showing that the changes in characteristics of the electronic device can be obtained by the change in gradient of the electronic device or the relative position thereof when the angle of a light source is fixed.

From the results, it can be seen that two different electrical characteristic of the device are reversibly changed depending on the change in incident angle of a light source. FIG. 3 shows a digital circuit diagram indicating that the route of light is changed depending on the incident angle thereof and thus two different characteristics of the same device, that is, a resistive memory (memristor) characteristic and a resistive (resistor) characteristic are reversibly changed. FIG. 3 is a schematic view showing that the changes in characteristics of the device can be obtained by the change in gradient of the device when the angle of a light source is fixed, and FIG. 3 is a schematic view expressing the conception that the front and rear of the critical angle can be distinguished according to the three-dimensional position of the device even when the relative position of the device is changed on a semicircle.

Figure 4A:
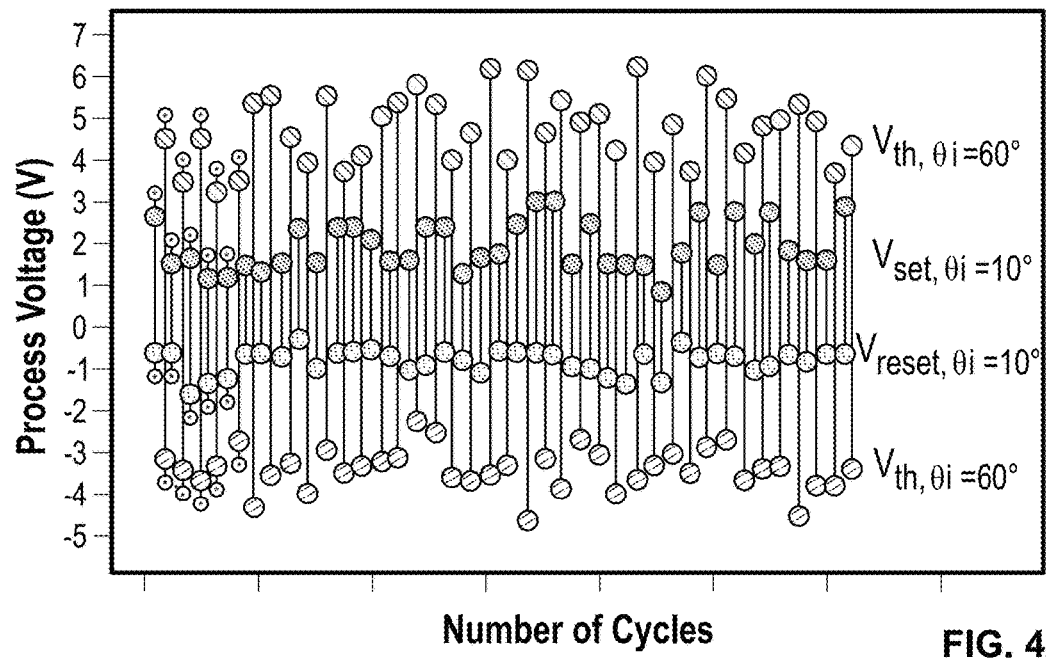
FIG. 4a shows that the process voltage according to the change in incident angle is reversibly represented in a stable range.
Figure 4B:
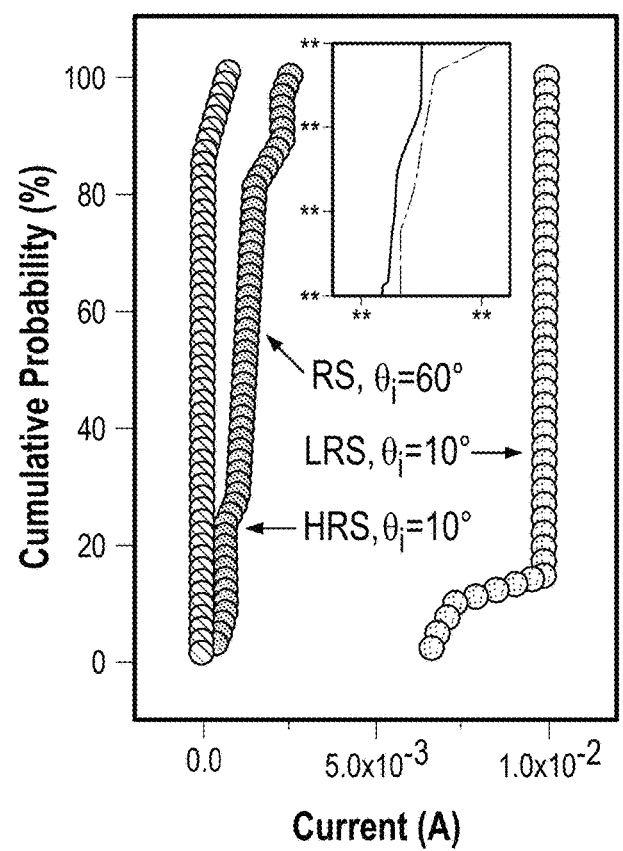
FIG. 4b shows that the cumulative probability of current extracted from the same voltage increases under the condition of a predetermined light incident angle.

It can be ascertained that the above-mentioned characteristics of the device are exhibited repeatedly and stably even though a series of procedures are performed in water. In FIG. 4, the Y axis means an applied voltage (Hereinafter, referred to as "process voltage") for reaching a current of 0.01 A or a current of −0.01 A. When the angle of the device is set to 10° (blue, red point) and 60° (green, orange-colored point) on the X axis each time and then the process voltages of the device, sequentially obtained from the resistive switching memory (memristor) and the resistor, are monitored every time, it can be seen that each of the process voltage values exists in a predetermined range. Thus, it can be ascertained that the device operates according to incident light angle without departing from inherent characteristics. Further, in FIG. 4b, when probabilities are arranged in ascending powers based on the current value obtained from each system, it can be clearly ascertained that current characteristics are converged, not diverged.

As described above, according to the present invention, there is provided a method of providing light incident angle dependency by a simple procedure of accumulating additional media in various electronic devices. In the method, the light incident angle selectivity of the electronic device can be maintained even when the inclination angle of the device is changed depending on the axis parallel to the incident direction of light even though the incident direction thereof is fixed. This means that the performance of the device can be controlled only by changing the inclination angle of the device without greatly changing the dynamic state of the device. Further, since the movement speed of photons is higher than that of electrons and the signal interference of photons is lower than that of electrons, an additional effect of increasing the operating speed of the device or decreasing the size of the device can be expected.

Further, according to the present invention, optical reactivity, particularly, incident angle selectivity can be provided to various conventional electronic devices only by post treatment, and the electronic device of the present invention can become a key for rapidly advancing an information processing technology together with a typical electronic circuit infrastructure.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention. Accordingly, any and all modifications, variations or equivalent arrangements should be considered to be within the scope of the invention, and the detailed scope of the invention will be disclosed by the accompanying claims.

What is claimed is:

1. A method of realizing resistor characteristics and memristor characteristics, comprising the
steps of:
applying light to an electronic device through water, wherein the electronic device is provided with a transparent hydrophobic layer including a nanostructure and gas, and electrical characteristics of the electronic device are changed depending on the amount of incident light; and
totally-reflecting or transmitting the light while changing the incident angle of the light, wherein the transparent hydrophobic layer comprises: zinc oxide nanowires vertically grown on a zinc oxide thin film to a length of 600 nm or less and treated with a fluorine compound; and air collected in layers between the zinc oxide nanowires.

2. The method of claim 1, wherein the electronic device is configured such that voltage is applied to upper and lower surfaces of a laminate including a transparent indium-doped tin oxide electrode layer, a glass substrate layer and a zinc oxide layer.

3. An electronic device having light incident angle selectivity, comprising:
a glass substrate coated with a transparent indium-doped tin oxide electrode;
a zinc oxide layer disposed on the glass substrate;
a gold electrode patterned on the zinc oxide layer;
a hydrophobic electronic device comprising a transparent hydrophobic layer including zinc oxide nanowires grown on the zinc oxide layer patterned with the gold electrode and surface-treated with a fluorine compound and air collected in layers between the zinc oxide nanowires;

a water layer existing on the surface of the hydrophobic electronic device; and a light source applying light to the electronic device, wherein the light applied to the electronic device is totally-reflected at a predetermined angle.

* * * * *